United States Patent
Bergendahl et al.

(10) Patent No.: US 7,589,557 B1
(45) Date of Patent: Sep. 15, 2009

(54) REVERSIBLE INPUT/OUTPUT DELAY LINE FOR BIDIRECTIONAL INPUT/OUTPUT BLOCKS

(75) Inventors: Jason R. Bergendahl, Sunnyvale, CA (US); Qi Zhang, Milpitas, CA (US); Jian Tan, Fremont, CA (US); Matthew H. Klein, Redwood City, CA (US)

(73) Assignee: Xilinx, Inc., San Jose, CA (US)

( * ) Notice: Subject to any disclaimer, the term of this patent is extended or adjusted under 35 U.S.C. 154(b) by 71 days.

(21) Appl. No.: 11/405,901

(22) Filed: Apr. 18, 2006

(51) Int. Cl.
    *H03K 19/173* (2006.01)
(52) U.S. Cl. .......................................... 326/41; 326/37
(58) Field of Classification Search .......... 326/37–41, 326/47, 56–58
    See application file for complete search history.

(56) References Cited

U.S. PATENT DOCUMENTS

| | | | | |
|---|---|---|---|---|
| 5,811,985 A | * | 9/1998 | Trimberger et al. | 326/38 |
| 6,020,760 A | * | 2/2000 | Sample et al. | 326/41 |
| 6,184,708 B1 | * | 2/2001 | Jenkins, IV | 326/39 |
| 7,098,690 B2 | * | 8/2006 | Nguyen et al. | 326/46 |

OTHER PUBLICATIONS

U.S. Appl. No. 10/889,248, filed Jul. 12, 2004, Zhang et al.
U.S. Appl. No. 10/938,151, filed Sep. 10, 2004, Zhang et al.
Xilinx, Inc.; Virtex-4 FPGA Handbook; published Aug. 2, 2004; available from Xilinx, Inc., 2100 Logic Drive, San Jose, California 95124; pp. 343-418.

* cited by examiner

*Primary Examiner*—James H. Cho
*Assistant Examiner*—Christopher Lo
(74) *Attorney, Agent, or Firm*—Lois D. Cartier; LeRoy D. Maunu

(57) ABSTRACT

An input/output (I/O) structure includes a delay element usable for the input path, the output path, or both input and output paths in a user design. In a first mode, the delay element is included in the input path. In a second mode, the delay element is included in the output path. In a third mode, the I/O structure includes the delay in both outgoing signal paths and incoming signal paths, e.g., by utilizing an output tristate signal to control the direction of the delay line. When the output buffer is driving, the delay is inserted in the output path. When the output buffer is tristated, the delay is inserted in the input path. Thus, a single delay element is dynamically shared by both input and output signals that use the same I/O pad. In an optional fourth mode, the delay element is bypassed by both input and output signals.

20 Claims, 7 Drawing Sheets

US 7,589,557 B1

REVERSIBLE INPUT/OUTPUT DELAY LINE FOR BIDIRECTIONAL INPUT/OUTPUT BLOCKS

FIELD OF THE INVENTION

The invention relates to integrated circuit devices (ICs). More particularly, the invention relates to a reversible input/output (I/O) delay line for a bidirectional I/O structure in an IC.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic. The term "programmable ICs" as used herein includes but is not limited to FPGAs, mask programmable devices, Programmable Logic Devices (PLDs), and devices in which only a portion of the logic is programmable.

Because of the programmable nature of PLDs, the internal delays of a user design implemented in a PLD varies with the circuit implementation. For example, a signal routed through a long signal path and/or several logic blocks is likely to have a larger delay than the same signal when routed through a short signal path that bypasses all logic blocks. Therefore, it is desirable to provide structures that provide for an adjustable delay on signal paths within a PLD.

Additionally or alternatively, electronic systems sometimes require or benefit from synchronization between system signals. Therefore, it is desirable to provide structures that allow for the synchronization of signals in an integrated circuit at contact points with the rest of the system, e.g., at input/output (I/O) pads of the integrated circuit.

SUMMARY OF THE INVENTION

The invention provides an input/output (I/O) structure that includes a delay element usable for the input path, the output path, or both input and output paths in a user design. In a first mode, the delay element is included in the input path. In a second mode, the delay element is included in the output path. In a third mode, the I/O structure includes the delay in both outgoing signal paths and incoming signal paths, e.g., by utilizing an output tristate signal to control the direction of the delay line. When the output buffer is driving the I/O pad, the delay is inserted in the output path. When the output buffer is tristated, the delay is inserted in the input path. Thus, a single delay element is dynamically shared by both input and output signals that use the same I/O pad in the same design. Some embodiments provide a fourth mode in which the delay element is bypassed by both input and output signals.

The I/O structures of the invention can be used, for example, for clock/data alignment (e.g., in source synchronous interfaces), noise reduction (by reducing the number of outputs switching simultaneously), deskewing board traces, and package deskew. However, the potential uses of the invention are not limited to these applications.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of integrated circuits (ICs). The present invention has been found to be particularly applicable and beneficial for programmable ICs such as programmable logic devices (PLDs). An appreciation of the present invention is therefore presented by way of specific examples utilizing PLDs such as field programmable gate arrays (FPGAs). However, the present invention is not limited by these examples.

Figure 1:
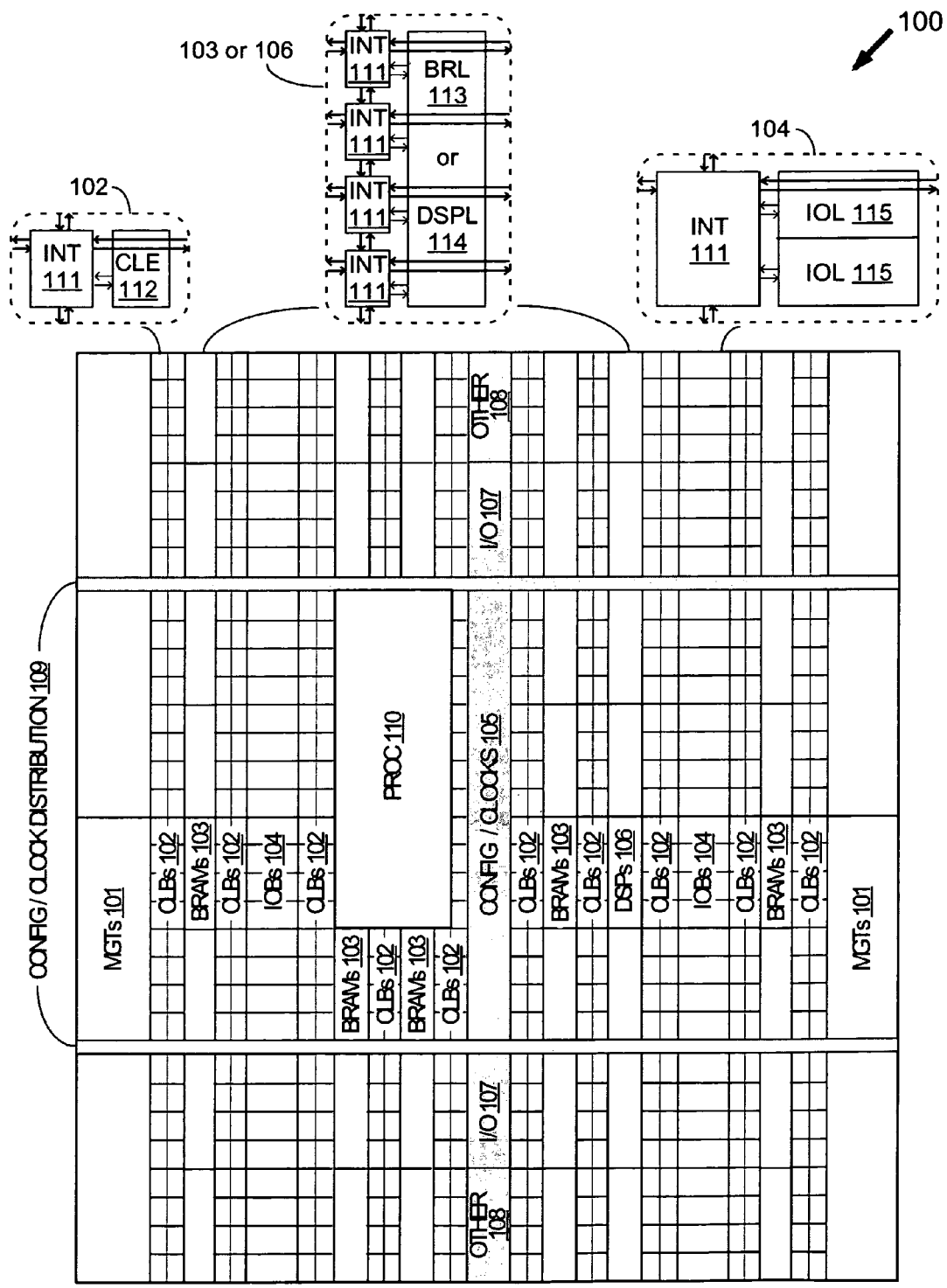
FIG. 1 illustrates a known programmable logic device (PLD).

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
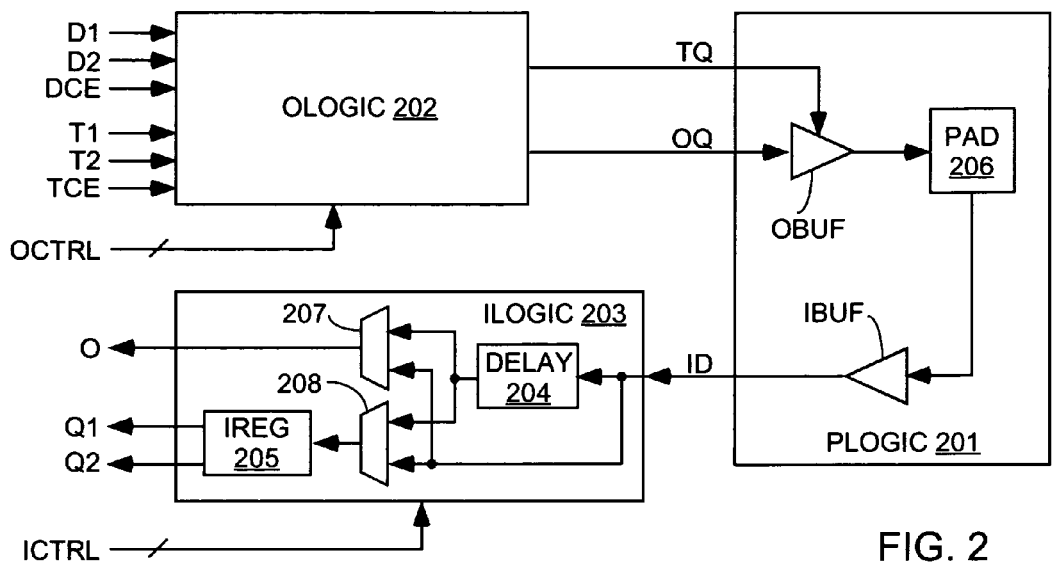
FIG. 2 illustrates an input/output (I/O) structure in the PLD of FIG. 1.

FIG. 2 illustrates an exemplary input/output (I/O) structure for the FPGA of FIG. 1. The logic in the I/O structure can be conceptually divided into three blocks of logic: pad logic (PLOGIC 201) providing a physical connection to the system outside the FPGA; output logic (OLOGIC 202) for providing output and tristate signals from the FPGA to the pad logic; and input logic (ILOGIC 203) for accepting and optionally registering an input signal received at the I/O pad, and providing the input signal to the FPGA. Further information on the I/O structure of FIG. 2 can be found in pages 343-418 of the "Virtex-4 FPGA Handbook", published Aug. 2, 2004 and available from Xilinx, Inc., which pages are hereby incorporated herein by reference.

The pad logic includes an I/O pad 206, an input buffer IBUF, and an output buffer OBUF, coupled together as shown in FIG. 2. It will be understood that the pad logic typically includes other well-known structures, e.g., ESD (electrostatic discharge) protection circuits and JTAG circuits, which are omitted from FIG. 2, for clarity. The output buffer OBUF includes a tristate control input terminal TQ by means of which the output buffer can be disabled, causing I/O pad 206 to function as an input pad. When the tristate control input signal has the opposite value (e.g., low), the output buffer is enabled and the output buffer OBUF drives the I/O pad, causing the I/O pad to function as an output pad. When the I/O structure is functioning in bi-directional mode, the tristate control input signal is typically driven by the user circuit to change back and forth between the two values. (Note that in the present specification, the same reference characters are used to refer to terminals, signal lines, and their corresponding signals.)

The input logic 203 includes a programmable delay element (DELAY 204), input path select multiplexers 207-208, and an input register (IREG 205), coupled together as shown in FIG. 2 and controlled by input control signals ICTRL. Multiple input paths are provided, including a registered input path providing signals Q1 and Q2 via input register 205, and an unregistered input path providing signal O. Programmable delay element 204 can be optionally bypassed or inserted in each signal path, as shown by multiplexers 207 and 208. Multiplexers 207 and 208 are independently controlled by configuration memory cells (not shown) of the FPGA. Note that the multiplexers shown in the figures herein can be assumed to be controlled by configuration memory cells (not shown) unless other sources for the control signals are indicated in the text or figures.

Figure 3:
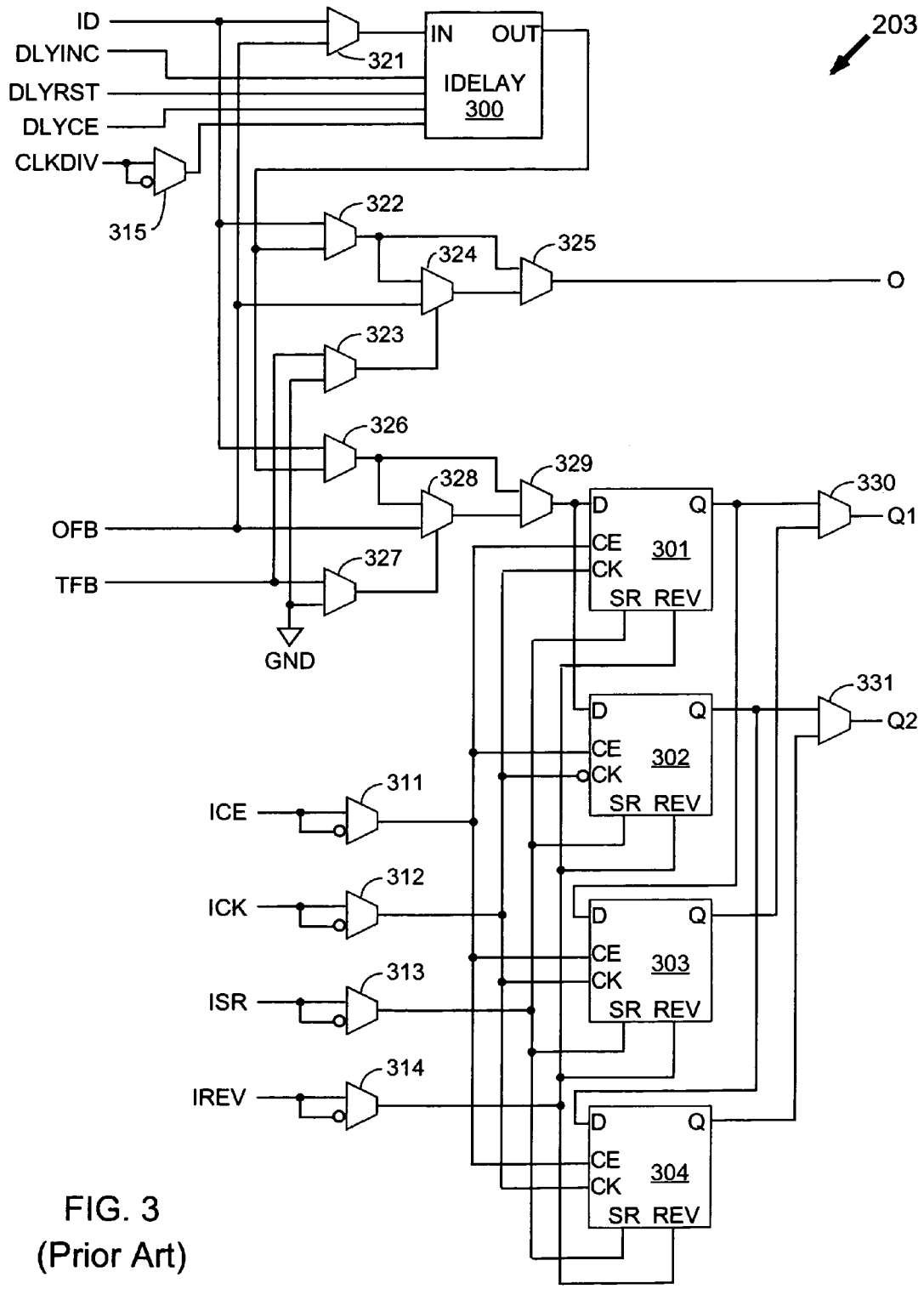
FIG. 3 illustrates the input logic in the I/O structure of FIG. 2.

FIG. 3 illustrates in more detail the input logic 203 in the I/O structure of FIG. 2. A programmable multiplexer 321 selects between the input data signal ID (e.g., from the input buffer IBUF of FIG. 2) and an alternative input signal OFB. Input signal OFB is an output feedback signal that comes from the output logic, allowing the output signal to be fed back to the input logic, bypassing the pad logic entirely. This signal can be used, for example, for testing the input and output logic. Multiplexer 321 drives the data input terminal of delay element 300, which is controlled by delay increment signal DLYINC, delay reset signal DLYRST, delay clock enable signal DLYCE, and delay clock signal CLKDIV (optionally inverted by programmable multiplexer 315). As selected by programmable multiplexers 322-325, the unregistered output signal O of input logic 203 can be any of input data signal ID (i.e., the delay element is bypassed), output signal OUT from delay element 300 (i.e., the delay element is inserted in the input path), or alternative input signal OFB. The selection of unregistered output signal O is also affected by the value of signal TFB, via multiplexers 323 and 324.

As selected by programmable multiplexers 326-329, the signal to be registered (the output of multiplexer 329, the D input of memory elements 301 and 302) can be any of input data signal ID (i.e., the delay element is bypassed), output signal OUT from delay element 300 (i.e., the delay element is inserted in the registered input path), or alternative input signal OFB. The selection of the signal to be registered is also affected by the value of signal TFB, via multiplexers 327 and 328.

The input register includes four memory elements 301-304, coupled together as shown in FIG. 3. The input register provides for optional DDR (double data rate) transfer of registered data. Each memory element 301-304 has a data input terminal D, a clock enable input terminal CE (provided by signal ICE, optionally inverted by programmable multiplexer 311), a clock input terminal CK (provided by signal ICK, optionally inverted by programmable multiplexer 312), a set/reset input terminal SR (provided by signal ISR, optionally inverted by programmable multiplexer 313), and a reverse (reset/set) input terminal REV (provided by signal IREV, optionally inverted by programmable multiplexer 314). Note that memory element 302 is clocked by the inversion of the clock signal of memory element 301, for example. This inversion provides the aforementioned DDR capability, in conjunction with programmable multiplexers 330 and 331 that provide registered output signals Q1 and Q2, respectively. Control signals DLYINC, DLYRST, DLYCE, CLKDIV, ICE, ICK, ISR, and IREV, along with signals OFB and TFB, collectively constitute input control signals ICTRL, shown in FIG. 2.

Figure 4:
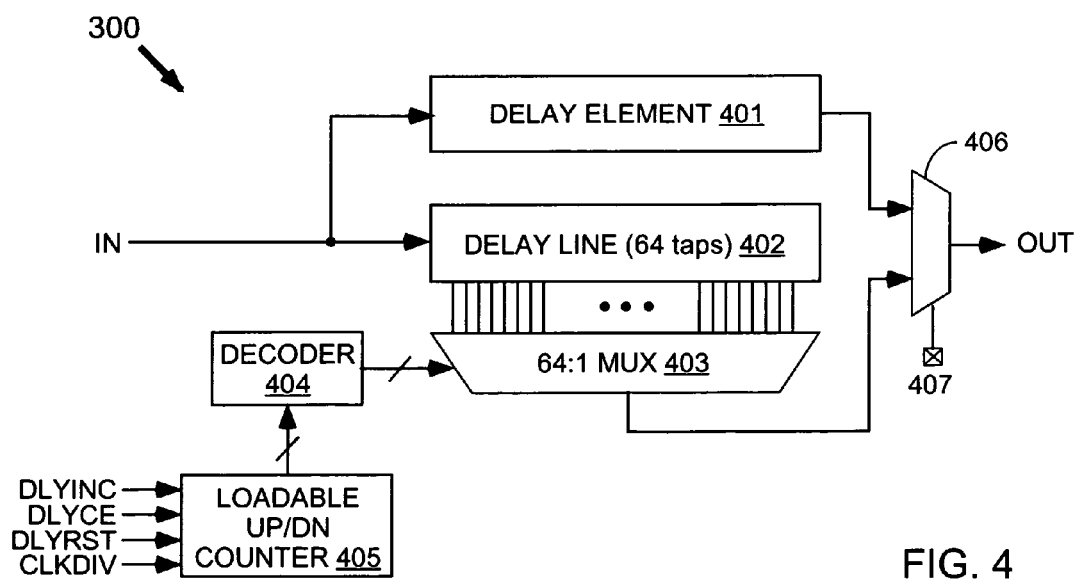
FIG. 4 illustrates a programmable delay element included in the input logic of FIG. 3.

FIG. 4 illustrates a programmable delay element 300 included in the input logic of FIG. 3. A non-programmable delay element 401 provides a "legacy" delay compatible with the input delays in previous FPGA devices. For example, the legacy delay can be designed to give a zero hold time for input register 205 when the input register is clocked with a global clock signal (see FIG. 2). 64-Tap delay line 402 provides a signal delayed by 64 incremental delays to a 64-to-1 multiplexer (MUX 403), which selects one of the tapped delays. Programmable multiplexer 406 is controlled by configuration memory cell 407 to select one of the two delayed values, either the legacy delay from delay element 401 or the tap delay from multiplexer 403. The selection of the tap delay by multiplexer 403 is controlled by decoder 404, which decodes a value from loadable up/down counter 405. Loadable up/down counter 405 in controlled by signals DLYINC, DLYRST, DLYCE, and CLKDIV (see FIG. 3) and includes a register of configuration memory cells storing the initial value to be loaded into the counter. In some embodiments, the CLKDIV signal can be optionally inverted, as shown in FIG. 3 (see programmable multiplexer 315). The value in counter 405 can be increased or decreased by applying a pulse on the CLKDIV signal when signal DLYCE is high and when signal DLYINC has a high or low value, respectively. The DLYRST signal can be used to reset the counter back to the initial value.

Figure 5:
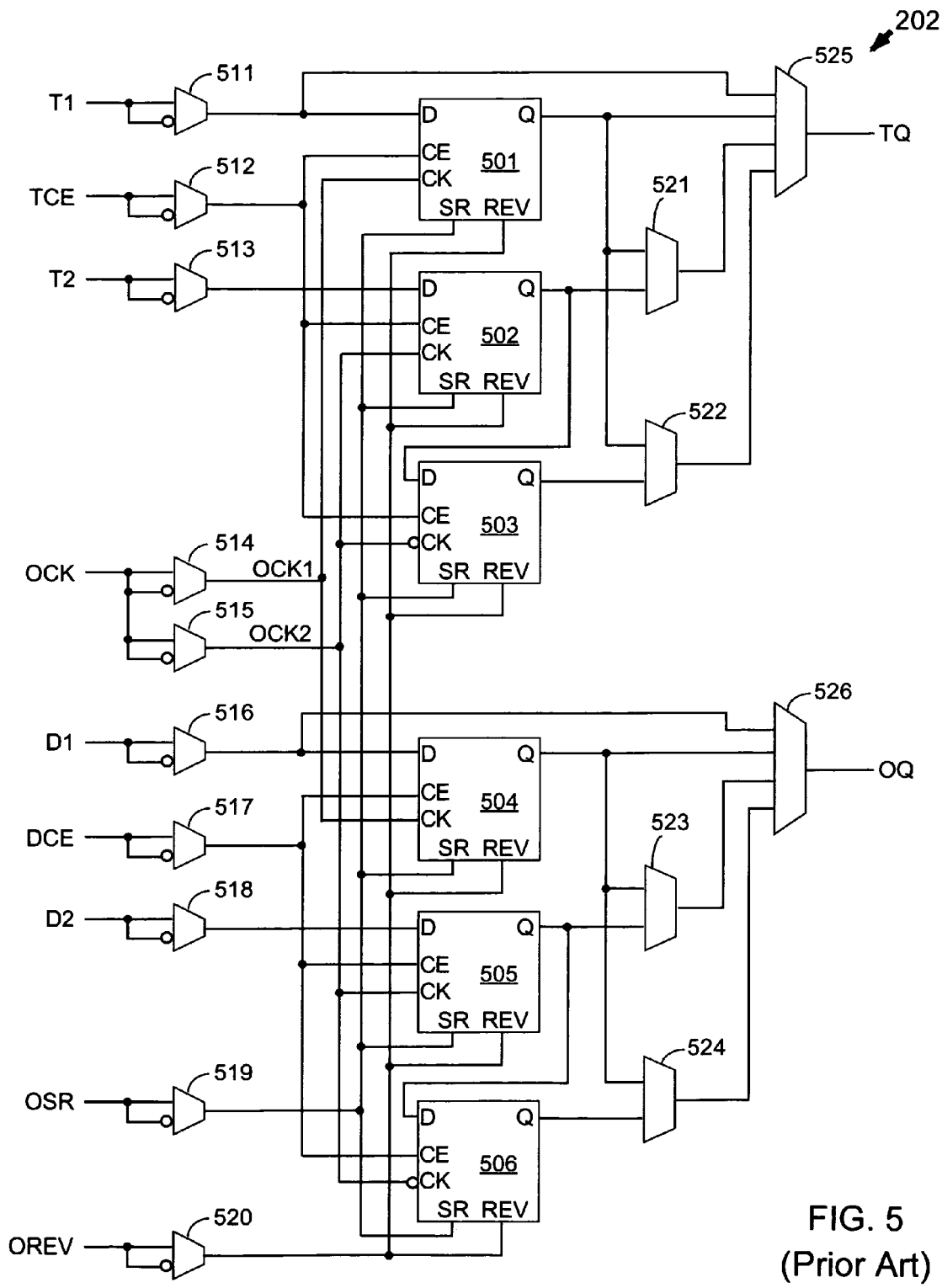
FIG. 5 illustrates the output logic in the I/O structure of FIG. 2.

FIG. 5 illustrates the output logic 202 in the I/O structure of FIG. 2. The output logic includes memory elements 501-506 and programmable multiplexers 511-526, coupled together as shown in FIG. 5. The output logic provides two optionally registered values, a data value OQ and a tristate control output signal TQ.

As selected by a programmable multiplexer 526, the data output signal OQ can be any of data signal D1 (i.e., the unregistered D1 value, optionally inverted by programmable multiplexer 516), the output signal Q from memory element 504 (i.e., the registered D1 value, optionally inverted by programmable multiplexer 516, directly or via one of programmable multiplexers 523-524), the output signal Q from memory element 505 (i.e., the registered D2 value, optionally inverted by programmable multiplexer 518, via multiplexer 523), or the output signal Q from memory element 506 (via multiplexer 524).

Each memory element 504-506 has a data input terminal D, a clock enable input terminal CE (provided by signal DCE, optionally inverted by programmable multiplexer 517), a clock input terminal CK (provided by signal OCK1 or OCK2, optionally inverted by programmable multiplexer 514 or 515, respectively), a set/reset input terminal SR (provided by signal OSR, optionally inverted by programmable multiplexer 519), and a reverse (reset/set) input terminal REV (provided by signal OREV, optionally inverted by programmable multiplexer 520). Note that memory element 506 is clocked by the inversion of the clock signal of memory element 505. This inversion provides DDR capability, in conjunction with programmable multiplexers 523-524 and 526.

Similarly, as selected by a programmable multiplexer 525, the tristate output signal TQ can be any of data signal T1 (i.e., the unregistered T1 value, optionally inverted by programmable multiplexer 511), the output signal Q from memory element 501 (i.e., the registered T1 value, optionally inverted by programmable multiplexer 511, directly or via one of programmable multiplexers 521-522), the output signal Q from memory element 502 (i.e., the registered T2 value, optionally inverted by programmable multiplexer 513, via multiplexer 521), or the output signal Q from memory element 503 (via multiplexer 522).

Each memory element 501-503 has a data input terminal D, a clock enable input terminal CE (provided by signal TCE, optionally inverted by programmable multiplexer 512), a clock input terminal CK (provided by signal OCK1 or OCK2, optionally inverted by programmable multiplexer 514 or 515, respectively), a set/reset input terminal SR (provided by signal OSR, optionally inverted by programmable multiplexer 519), and a reverse (reset/set) input terminal REV (provided by signal OREV, optionally inverted by programmable multiplexer 520). Note that memory element 503 is clocked by the inversion of the clock signal of memory element 502. This inversion provides the aforementioned DDR capability, in conjunction with programmable multiplexers 521-522 and 525. Control signals OCK, OSR, and OREV collectively constitute output control signals OCTRL, shown in FIG. 2.

A drawback of the I/O structure of FIGS. 2-5 is that no programmable delay is available on the output path, e.g., between the data output terminal OQ of the output logic 202 and the output buffer OBUF (see FIG. 2). A system designer can sometimes benefit by adding delay on the output path in order to reduce SSO (simultaneously switching output) noise, to compensate for signal skew in the IC package, or to compensate for signal skew on the board, for example. Clearly, an additional delay element could be added on the output path, e.g., an additional delay element 204 could be included in the output logic block 202 illustrated in FIG. 2. However, the structure of FIG. 4, for example, is fairly large and it would consume significant silicon area to implement a second such structure for each I/O pad.

Therefore, an alternative I/O delay structure is now described that includes only one delay element, but allows for a programmable delay on the input path, the output path, neither the input path nor the output path, or both the input path and the output path of a single I/O pad, or, in the case of differential signaling, a pair of I/O pads. In the illustrated embodiment, an output tristate control signal can be utilized to control the direction of the delay line. When the output buffer is driving the I/O pad, the delay can be inserted on the output path. When the output buffer is tristated, the delay can be inserted on the input path. Thus, a single delay element can be shared by both input and output signals that use the same I/O pad in the same design.

Figure 6:
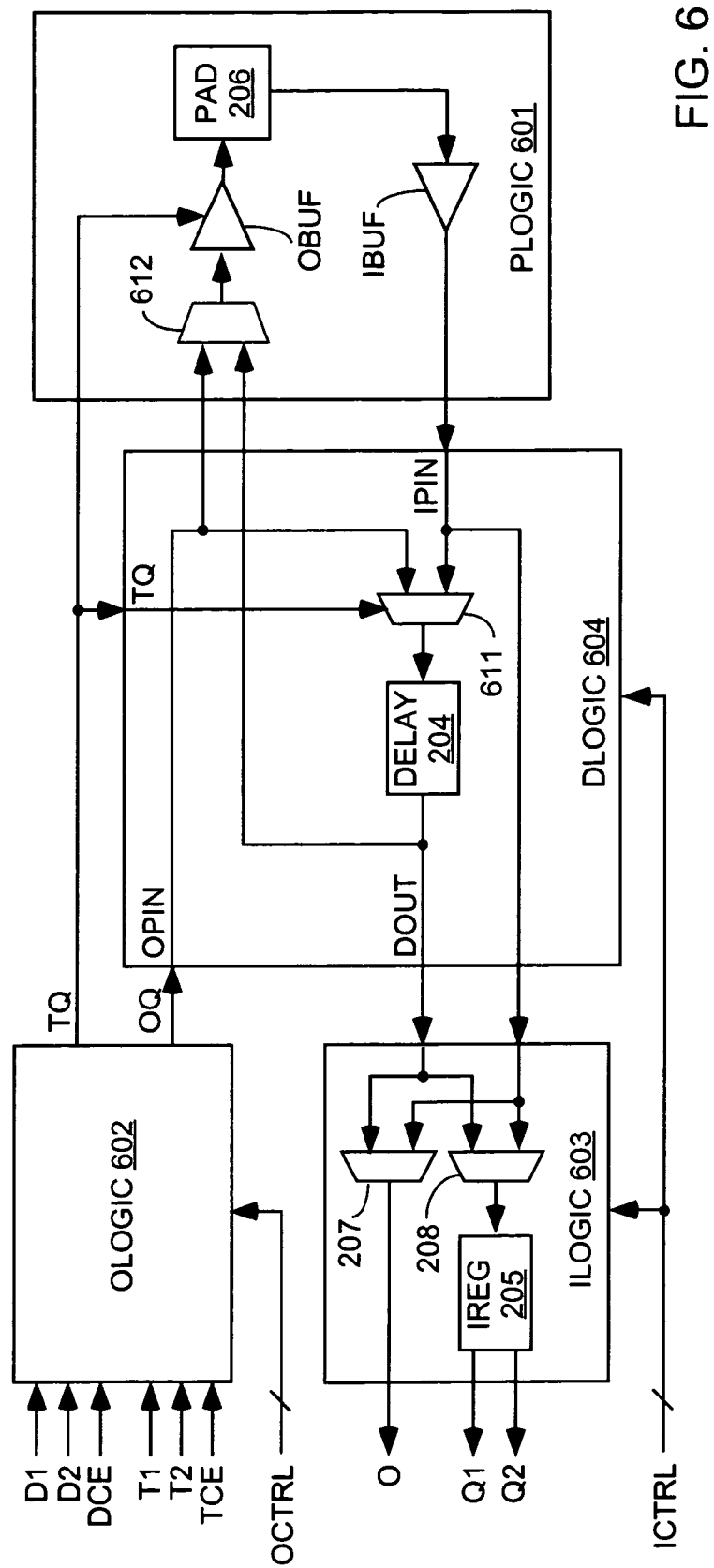
FIG. 6 illustrates a novel I/O structure that provides a delay element usable for the input path, the output path, or both input and output paths in a user design.

FIG. 6 illustrates an exemplary I/O structure providing these capabilities. The I/O structure of FIG. 6 includes pad logic (PLOGIC 601), output logic (OLOGIC 602), input logic (ILOGIC 603), and delay logic (DLOGIC 604). Output logic 602 can be the same, for example, as the output logic 202 illustrated in FIG. 2. The input logic 603 can be the same, for example, as the input logic 203 illustrated in FIG. 2, but with the delay element 204 removed. The pad logic 601 can be the same, for example, as the pad logic 201 of FIG. 2, but with the addition of a programmable multiplexer 612. When the I/O structure forms at least a portion of an FPGA, for example, programmable multiplexer 612 can be controlled by values stored in configuration memory cells of the FPGA (not shown). In the pictured embodiment, programmable multiplexer 612 selects between the data output signal OQ from output logic 602 and the delayed signal DOUT from delay logic 604, and passes the selected signal to the output buffer OBUF.

The delay logic 604 illustrated in FIG. 6 includes a delay element that can be, for example, the same as delay element 204 of FIG. 4. In other embodiments, other delay elements (programmable or non-programmable) are used. When the I/O structure forms at least a portion of an FPGA, for example, programmable multiplexer 611 can be controlled by values stored in configuration memory cells of the FPGA (not shown). Programmable multiplexer 611 provides the option of selecting the input signal IPIN from the input buffer IBUF, or the data output signal OQ (OPIN), to drive the delay element 204. In the pictured embodiment, multiplexer 611 is controlled by the same tristate control signal TQ that controls the output buffer OBUF. Therefore, the same signal that controls the functionality of I/O pad 206 (i.e., input or output) also controls whether delay element 204 is included on the input path or the output path of the I/O structure. Hence, when the functionality of I/O pad 206 is dynamically controlled (i.e., can change values during operation of the user circuit), the delay logic can also be dynamically controlled via signal TQ.

Clearly, by selectively programming the values controlling multiplexers 611, 612, 207, and 208, the delay element 204 can be included in the input path, the output path, both paths (depending on the value of TQ), or neither the input nor the output path.

Figure 7:
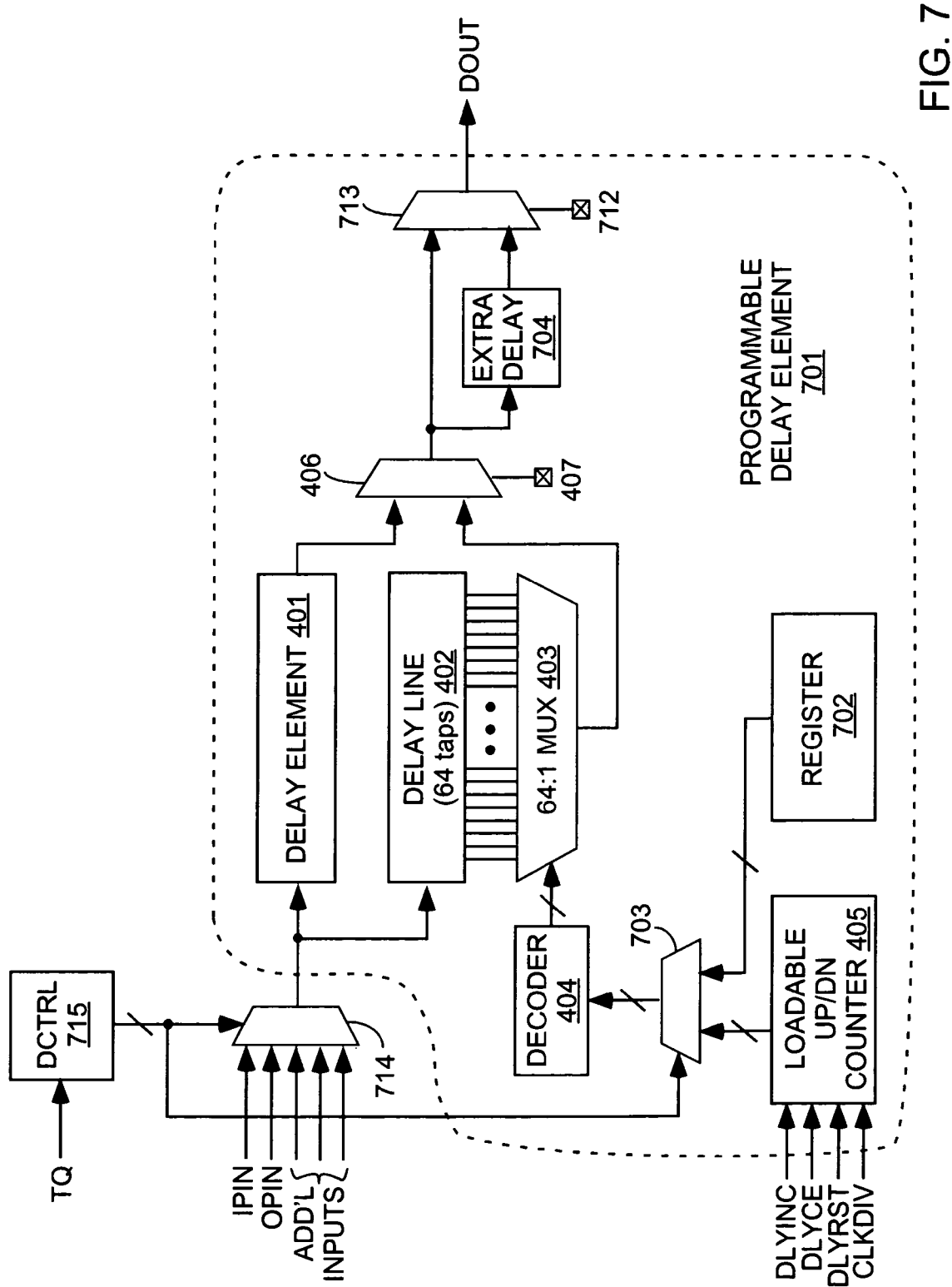
FIG. 7 illustrates exemplary delay logic that can be used, for example, in the I/O structure illustrated in FIG. 6.

FIG. 7 illustrates another embodiment of delay logic 604 that can optionally be used in the I/O structure illustrated in FIG. 6. Note that any delay element can be used in the embodiment of FIG. 6, as long as it meets the needs of the integrated circuit design and the system design. Therefore, the embodiment illustrated in FIG. 7 is purely exemplary.

The delay logic illustrated in FIG. 7 includes a programmable delay element 701, a delay multiplexer 714, and delay control logic 715. Under the control of delay control logic 715, delay multiplexer 714 selects one of five input values (for example) to provide to programmable delay element 701. The input values include signal IPIN and OPIN from FIG. 6, and can also include additional signals such as a JTAG input signal and/or an input signal from elsewhere in the integrated circuit (e.g., from the programmable fabric, when the integrated circuit is an FPGA). For example, by routing an internal signal from the programmable fabric of the FPGA through the programmable delay element, the delay on the internal signal can be adjusted as needed. In some embodiments, for example, the output signal DOUT from the delay element is inverted and fed back into the delay element via the delay multiplexer. This feedback arrangement creates a dynamically controlled loop oscillator, which can be used, for example, to characterize the delay element.

In the pictured embodiment, the programmable delay element 701 is similar to delay element 300 of FIG. 4, but with the addition of a register 702, a multiplexer 703, and a small circuit that provides an optional supplemental delay. Register 702 can be loaded, for example, by programming configuration data into the register as part of a configuration process for an FPGA. Multiplexer 703 selects either the output of register 702 or the output of the loadable up/down counter 405, under the control of delay control logic 715. The supplemental delay circuit includes an extra delay element 704 and a multiplexer 713 controlled by a configuration memory cell 712, coupled together as shown in FIG. 7. The supplemental delay can be used, for example, to provide a larger delay value than can be supported by delay line 402.

In a first mode, the delay element is included in the input path, and is not included in the output path. This mode can be selected, for example, by setting configuration memory cells in delay control logic 715 to select the IPIN signal in multiplexer 714. In this mode, the amount of delay inserted in the input path can be dynamically controlled using up/down counter 405 as in the known delay line of FIG. 4. Therefore, multiplexer 703 is controlled by delay control logic 715 to select the output of up/down counter 405 to provide to decoder 404. Note that in this mode, configuration memory cells controlling programmable multiplexers 207 and/or 208 are set to select the DOUT value (see FIG. 6), and configuration memory cells controlling programmable multiplexer 612 are set to select the OPIN (OQ) value (see FIG. 6).

In a second mode, the delay element is included in the output path, and is not included in the input path. This mode can be selected, for example, by setting configuration memory cells in delay control logic 715 to select the OPIN signal in multiplexer 714. In this mode, the amount of delay inserted in the output path is pre-programmed using a value stored in register 702, which can also be implemented, for example, using configuration memory cells. Therefore, multiplexer 703 is controlled by delay control logic 715 to select the output of register 702 to provide to decoder 404. Note that in this mode, configuration memory cells controlling programmable multiplexers 207 and 208 are set to select the IPIN value, and configuration memory cells controlling programmable multiplexer 612 are set to select the DOUT value (see FIG. 6).

In a third mode, the delay element is included in both the input path and the output path. The third mode is also selected by setting configuration memory cells in delay control logic 715, but the value of tristate control signal TQ also affects the operation of the delay logic. When the tristate control signal TQ has a first value (e.g., high), the output buffer OBUF is tristated (see FIG. 6), and the delay is applied to the input path. In other words, delay control logic 715 controls multiplexer 714 to select the IPIN signal, and further controls multiplexer 703 to select the output of up/down counter 405. When the tristate control signal TQ has a second value (e.g., low), the output buffer OBUF is driving (see FIG. 6), and the delay is applied to the output path. In other words, delay control logic 715 controls multiplexer 714 to select the OPIN signal, and further controls multiplexer 703 to select the output of register 702. Note that in this mode, configuration memory cells controlling programmable multiplexer 612 are set to select the DOUT value (see FIG. 6). The delayed input data will appear at the input terminal of the output buffer OBUF, but will not be driven onto pad 206 due to the state of the tristate control signal TQ. Configuration memory cells controlling programmable multiplexers 207 and/or 208 are also set to select the DOUT value. The delayed output values are ignored by the destination logic (e.g., register IREG 205 or internal logic of the device) when the delay element is being used for the output path.

Note that in some embodiments (not shown), register 702 is replaced by a second loadable up/down counter, providing dynamic control to the delay value on the output path. Control signals for the second up/down counter can be shared with the first up/down counter 405, or the two counters can be independently controlled. However, these embodiments use additional silicon area compared to the embodiment of FIG. 7. In some embodiments (not shown), loadable up/down counter 405 is replaced by a second register. In some embodiments (not shown), loadable up/down counter 405 and register 702 have opposite functionality, e.g., counter 405 is selected when the I/O pad is functioning as an output pad, and register 702 is selected when the I/O pad is functioning as an input pad. In some embodiments, counter 405, register 702, and multiplexer 703 are replaced by a single counter that can store and retrieve count values, e.g., based on the value of a control signal from delay control logic 715.

In a fourth mode, the delay element is bypassed by both the input path and the output path. In this embodiment, configuration memory cells controlling programmable multiplexers 207 and 208 are set to select the IPIN value, and configuration memory cells controlling programmable multiplexer 612 are set to select the OPIN value (see FIG. 6). From a logical standpoint, it does not matter which input is selected by programmable multiplexer 611, as the output signal from delay element 204 is not used.

Note that the pictured embodiment supports other modes in addition to the first, second, third, and fourth modes described above. For example, the additional inputs to multiplexer 714 can be used to implement a JTAG mode, a delay feedback mode, a general-purpose internal delay mode, and so forth.

Figure 8:
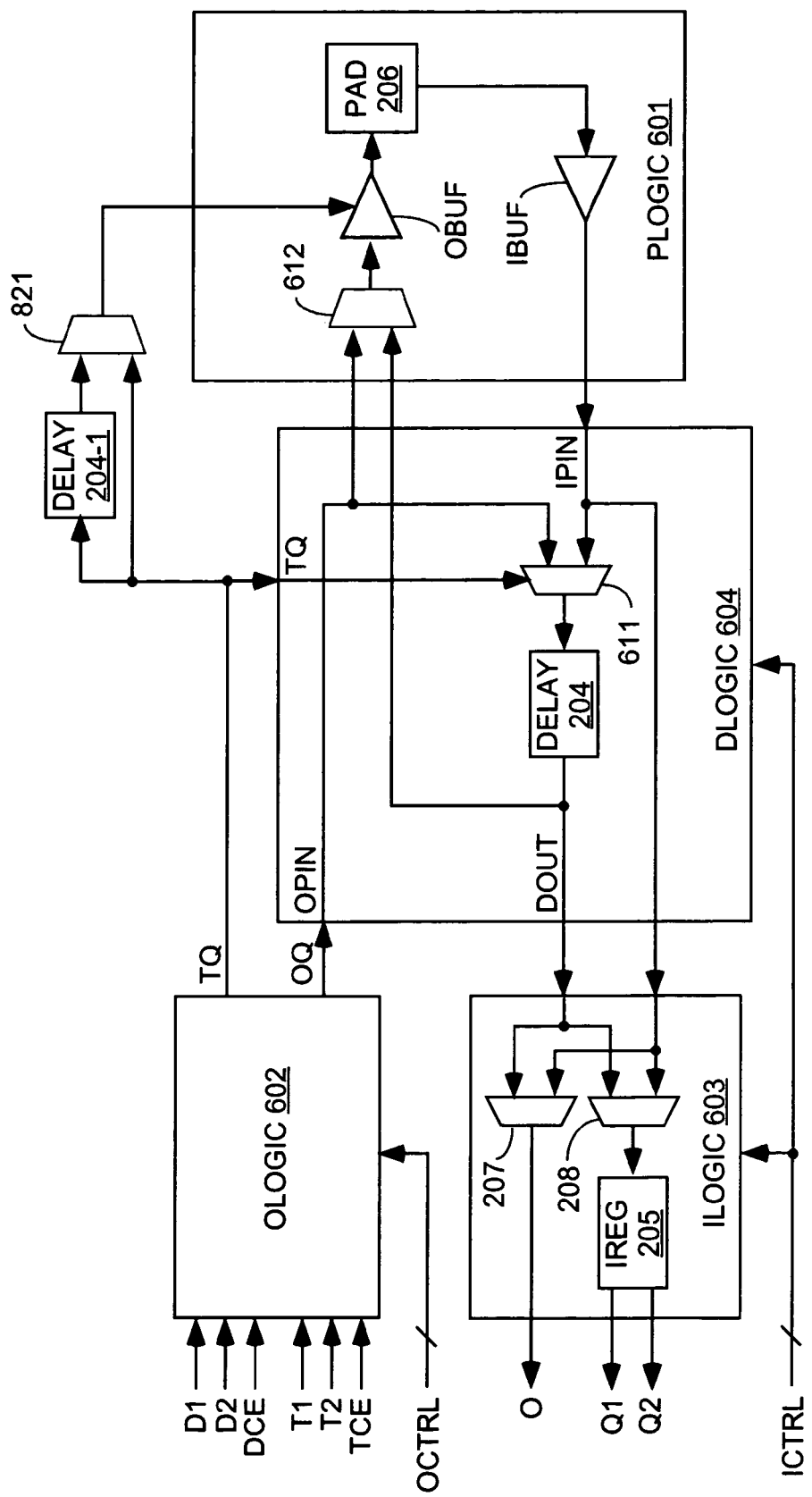
FIG. 8 illustrates a second novel I/O structure that provides a delay element usable for the input path, the output path, or both input and output paths in a user design.

FIG. 8 illustrates an exemplary I/O structure similar to the structure of FIG. 6. Like elements are similarly numbered, and only the new circuit elements are described, to avoid unnecessary repetition. The I/O structure of FIG. 8 includes a second delay element 204-1 that can be optionally inserted on the signal path between the TQ output of output logic 602 and the tristate input terminal of output buffer OBUF. The insertion is done downstream of the point where the TQ output of output logic 602 is coupled to the TQ input terminal of delay logic 604. The optional delay element is inserted or not inserted into the signal path depending on the state of programmable multiplexer 821. When the I/O structure of FIG. 8 forms at least a portion of an FPGA, for example, programmable multiplexer 821 can be controlled by a value stored in a configuration memory cell of the FPGA (not shown). Delay element 204-1 can be implemented, for example, in the same fashion and having substantially the same delay as delay element 204. The delay of delay element 204-1 can then be set to the same value as the delay of delay element 204. In this embodiment, inserting the first delay 204 on the output data path and inserting the second delay 204-1 on the tristate enable path ensures that the output data signal and the tristate enable signal are not skewed with respect to one another at the output buffer OBUF.

In the included descriptions and drawings, numerous specific details are set forth to provide a more thorough understanding of the present invention. However, it will be apparent to one skilled in the art that the invention can be practiced without these specific details. For example, delay element 701 can be implemented in many different ways. In some embodiments non-programmable delay element 401, multiplexer 406, and configuration memory cell 407 are omitted from programmable delay element 701. In some embodiments, multiplexer 403 is directly controlled by values stored in configuration memory cells, and elements 404, 405, 702, and 703 are omitted. In some embodiments, elements 704, 712, and 713 are omitted. In some embodiments, delay element 401 is programmable. In some embodiments, delay element 701 is not programmable, and so forth.

In some embodiments, the tristate control signal comes from elsewhere in the integrated circuit, rather than being provided to the delay logic and the pad logic from the output logic as in the illustrated embodiments. In some embodiments, the "TQ" signal applied to the delay logic (e.g., see FIG. 7) is replaced by a signal that is unrelated to tristate control. Further, some embodiments of the invention support fewer than all of the first, second, third, and fourth modes described above. For example, in one embodiment, only the third mode is supported. Note that this embodiment can be used in a non-programmable integrated circuit, because only a single operating mode is used. In another embodiment, only the first and second modes are supported, and so forth.

In some embodiments, two I/O pads are used for each I/O signal. In these embodiments, the signal is a differential signal. Differential I/O signals and I/O structures are well known, and it will be clear to those of skill in the art that the I/O structures of the present invention can be readily adapted to accommodate differential I/O signals.

It will be clear to those of skill in the art that the present invention encompasses these and other architectural variations.

Further, delay elements, delay lines, multiplexers, multiplexer circuits, programmable multiplexers, memory elements, registers, decoders, counters, input logic, output logic, pad logic, delay logic, configuration memory cells, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. An integrated circuit, comprising:
 an input/output (I/O) pad;
 an input buffer having an input terminal coupled to the I/O pad and further having an output terminal;

an output buffer having an input terminal and further having an output terminal coupled to the I/O pad;
a delay element having an input terminal and an output terminal;
wherein the delay element includes a delay line, and for an input signal received at the input buffer, the delay element delays a signal through the delay line by a first delay, and for an output signal to be output at the output buffer the delay element delays a signal through the delay line by a second delay;
wherein the first delay and the second delay are individually programmable to provide different amounts of delay for the input and output signals;
a delay multiplexer circuit having a first data input terminal, a second data input terminal coupled to the output terminal of the input buffer, and a data output terminal coupled to the input terminal of the delay element;
an output multiplexer circuit having a first data input terminal coupled to the first data input terminal of the delay multiplexer circuit, a second data input terminal coupled to the output terminal of the delay element, and an output terminal coupled to the input terminal of the output buffer; and
an input multiplexer circuit having a first data input terminal coupled to the second data input terminal of the delay multiplexer circuit, a second data input terminal coupled to the output terminal of the delay element, and an output terminal.

2. The integrated circuit of claim 1, wherein:
the output buffer comprises a tristate control input terminal; and
the delay multiplexer circuit comprises a select input terminal coupled to the tristate control input terminal of the output buffer.

3. The integrated circuit of claim 2, further comprising output logic having a tristate control output terminal coupled to the tristate control input terminal of the output buffer and to the select input terminal of the delay multiplexer circuit.

4. The integrated circuit of claim 2, further comprising delay control logic coupled between the tristate control output terminal of the output logic and the select input terminal of the delay multiplexer circuit.

5. The integrated circuit of claim 1, wherein the integrated circuit comprises a programmable integrated circuit, and the delay element comprises a programmable delay element.

6. The integrated circuit of claim 5, wherein the programmable integrated circuit comprises a field programmable gate array (FPGA), and wherein the programmable delay element comprises configuration memory cells of the FPGA.

7. An integrated circuit, comprising:
an input/output (I/O) pad;
pad logic coupled to the I/O pad, the pad logic having a data input terminal and an output terminal;
input logic having an input terminal;
output logic having a data output terminal; and
delay logic coupled to the data input terminal of the pad logic, the output terminal of the pad logic, the input terminal of the input logic, and the data output terminal of the output logic, the delay logic comprising:
a delay element;
a first signal path between the data output terminal of the output logic and the data input terminal of the pad logic, wherein the first signal path traverses the delay element; and
a second signal path between the output terminal of the pad logic and the input terminal of the input logic, wherein the second signal path traverses the delay element;
wherein the delay element includes a delay line, and for an input signal at the output terminal of the pad logic, the delay element delays a signal through the delay line by a first delay, and for an output signal to be output at the input terminal of the pad logic, the delay element delays a signal through the delay line by a second delay; and
wherein the first delay and the second delay are individually programmable to provide different amounts of delay for the input and output signals.

8. The integrated circuit of claim 7, wherein the output logic further comprises a tristate control output terminal coupled to the delay logic and further coupled to a tristate control input terminal of the pad logic.

9. The integrated circuit of claim 8, wherein the delay logic further comprises a multiplexer circuit having a first data input terminal coupled to the data output terminal of the output logic, a second data input terminal coupled to the output terminal of the pad logic, a select terminal coupled to the tristate control output terminal of the output logic, and an output terminal coupled to the delay element.

10. The integrated circuit of claim 7, further comprising delay control logic coupled between the tristate control output terminal of the output logic and the delay logic.

11. The integrated circuit of claim 7, wherein the integrated circuit comprises a programmable integrated circuit, and wherein the delay element comprises a programmable delay element.

12. The integrated circuit of claim 11, wherein the programmable integrated circuit comprises a field programmable gate array (FPGA), and wherein the programmable delay element comprises configuration memory cells of the FPGA.

13. The integrated circuit of claim 7, further comprising:
means for selecting between the first and second signal paths.

14. The integrated circuit of claim 13, wherein the means for selecting comprises means for selecting the first signal path when the I/O pad is functioning as an output pad and selecting the second signal path when the I/O pad is functioning as an input pad.

15. The integrated circuit of claim 13, wherein the means for selecting comprises means for selecting between the first and second delays.

16. The integrated circuit of claim 7, wherein the delay logic further comprises:
a third signal path between the data output terminal of the output logic and the data input terminal of the pad logic, wherein the third signal path bypasses the delay element; and
a fourth signal path between the output terminal of the pad logic and the input terminal of the input logic, wherein the fourth signal path bypasses the delay element.

17. The integrated circuit of claim 16, further comprising:
means for selecting between the first and second signal paths;
means for selecting between the first and third signal paths; and
means for selecting between the second and fourth signal paths.

18. An integrated circuit, comprising:
a input/output (I/O) pad;

pad logic coupled to the I/O pad, the pad logic having a data input terminal and an output terminal;

input logic having an input terminal;

output logic having a data output terminal;

a delay element having input and output terminals;

wherein the delay element includes a delay line, and for an input signal at the output terminal of the pad logic, the delay element delays a signal through the delay line by a first delay, and for an output signal to be output at the input terminal of the pad logic, the delay element delays a signal through the delay line by a second delay; and wherein the first delay and the second delay are individually programmable to provide different amounts of delay for the input and output signals;

first programmable means for coupling the input terminal of the delay element to a selected one of the data output terminal of the output logic and the output terminal of the pad logic;

second programmable means for coupling the data input terminal of the pad logic to a selected one of the data output terminal of the output logic and the output terminal of the delay element; and third programmable means for coupling the input terminal of the input logic to a selected one of the output terminal of the pad logic and the output terminal of the delay element.

19. The integrated circuit of claim 18, wherein the output logic further comprises a tristate control output terminal coupled to the first programmable means and further coupled to a tristate control input terminal of the pad logic.

20. The integrated circuit of claim 18, wherein the integrated circuit comprises a programmable integrated circuit, and the delay element comprises a programmable delay element.

* * * * *